US010910533B2

(12) United States Patent
Takizawa et al.

(10) Patent No.: US 10,910,533 B2
(45) Date of Patent: Feb. 2, 2021

(54) PLANAR LIGHT SOURCE DEVICE AND DISPLAY DEVICE

(71) Applicant: ENPLAS CORPORATION, Saitama (JP)

(72) Inventors: Masayo Takizawa, Saitama (JP); Akinobu Seki, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/482,813

(22) PCT Filed: Feb. 2, 2018

(86) PCT No.: PCT/JP2018/003662
§ 371 (c)(1),
(2) Date: Aug. 1, 2019

(87) PCT Pub. No.: WO2018/143432
PCT Pub. Date: Aug. 9, 2018

(65) Prior Publication Data
US 2020/0235268 A1    Jul. 23, 2020

(30) Foreign Application Priority Data
Feb. 3, 2017  (JP) ................................. 2017-018720

(51) Int. Cl.
*H01L 33/58*       (2010.01)
*H01L 25/075*      (2006.01)
(Continued)

(52) U.S. Cl.
CPC .......... *H01L 33/58* (2013.01); *G09F 13/0404* (2013.01); *G02F 1/133602* (2013.01); *G02F 1/133606* (2013.01); *G09F 2013/1854* (2013.01)

(58) Field of Classification Search
None
See application file for complete search history.

(56) References Cited

U.S. PATENT DOCUMENTS 7,738,196 B2 *  6/2010  Seki ....................... G02B 7/028
                                                    359/820
8,777,458 B2 *  7/2014  Seki ................... G02B 19/0061
                                                    362/332
(Continued)

FOREIGN PATENT DOCUMENTS

JP       2009289506 A       12/2009
JP       2013148739    *    8/2013  ............. G09F 13/04

OTHER PUBLICATIONS

International Search Report from International Application No. PCT/JP2018/003662 dated Apr. 10, 2018.

*Primary Examiner* — Zandra V Smith
*Assistant Examiner* — Lawrence C Tynes, Jr.
(74) *Attorney, Agent, or Firm* — Brundidge & Stanger, P.C.

(57) ABSTRACT

This planar light source device has a pair of substrates, a pair of irradiation plates disposed between the pair of substrates, and a plurality of light emission devices disposed on one or both of the pair of substrates. In a cross-section of the light emission devices in a direction perpendicular to the irradiation plates through an optical axis, the luminosity of light emitted in a 7.0° direction when 0° is the optical axis direction and the luminosity of light emitted in a (tan−1(t/L))° (where t represents the gap between the irradiation plates, and L represents the gap, in a direction along the pair of irradiation plates, from the surface of a light emission device disposed on one of the substrates to an end part of the other-substrate-side irradiation plate) direction or a (tan−1 (t/2L))° direction satisfy a prescribed relationship.

4 Claims, 11 Drawing Sheets

(51) Int. Cl.
  *G09F 13/04* (2006.01)
  *G09F 13/18* (2006.01)
  *G02F 1/13357* (2006.01)

(56) References Cited

U.S. PATENT DOCUMENTS

| | | | |
|---|---|---|---|
| 8,827,478 B2 * | 9/2014 | Kuromizu | G02F 1/133605 362/97.1 |
| 8,827,491 B2 * | 9/2014 | Takatori | F21V 7/0083 362/247 |
| 8,926,156 B2 * | 1/2015 | Seki | F21V 7/00 362/606 |
| 8,939,618 B2 * | 1/2015 | Kawahara | G02B 19/0071 362/433 |
| 9,222,646 B2 * | 12/2015 | Seki | G02B 3/06 |
| 9,435,514 B2 * | 9/2016 | Takatori | F21V 13/02 |
| 9,568,163 B2 * | 2/2017 | Takatori | F21V 7/0091 |
| 9,863,614 B2 * | 1/2018 | Seki | F21V 17/14 |
| 10,190,730 B2 * | 1/2019 | Yamada | F21V 3/00 |
| 10,249,223 B2 * | 4/2019 | Takizawa | G02B 27/30 |
| 10,480,721 B2 * | 11/2019 | Seki | G02B 19/0014 |
| 10,520,163 B2 * | 12/2019 | Shinohara | F21V 7/045 |
| 10,563,825 B2 * | 2/2020 | Seki | F21V 5/04 |
| 2004/0130884 A1 * | 7/2004 | Yoo | G02B 6/0068 362/613 |
| 2010/0142220 A1 * | 6/2010 | Lee | G02B 6/0055 362/609 |
| 2011/0255291 A1 * | 10/2011 | Seki | G02B 19/0028 362/297 |
| 2014/0233217 A1 * | 8/2014 | Takatori | G09F 13/04 362/97.1 |
| 2015/0176801 A1 * | 6/2015 | Takatori | F21S 8/04 362/97.1 |
| 2015/0219936 A1 * | 8/2015 | Kim | G02F 1/133602 362/97.1 |
| 2015/0279251 A1 * | 10/2015 | Matyear | H02S 40/38 362/183 |
| 2016/0363821 A1 * | 12/2016 | Lee | G02F 1/134309 |
| 2018/0067253 A1 * | 3/2018 | Ting | G09F 13/12 |
| 2018/0175264 A1 * | 6/2018 | Lee | H01L 33/58 |

* cited by examiner

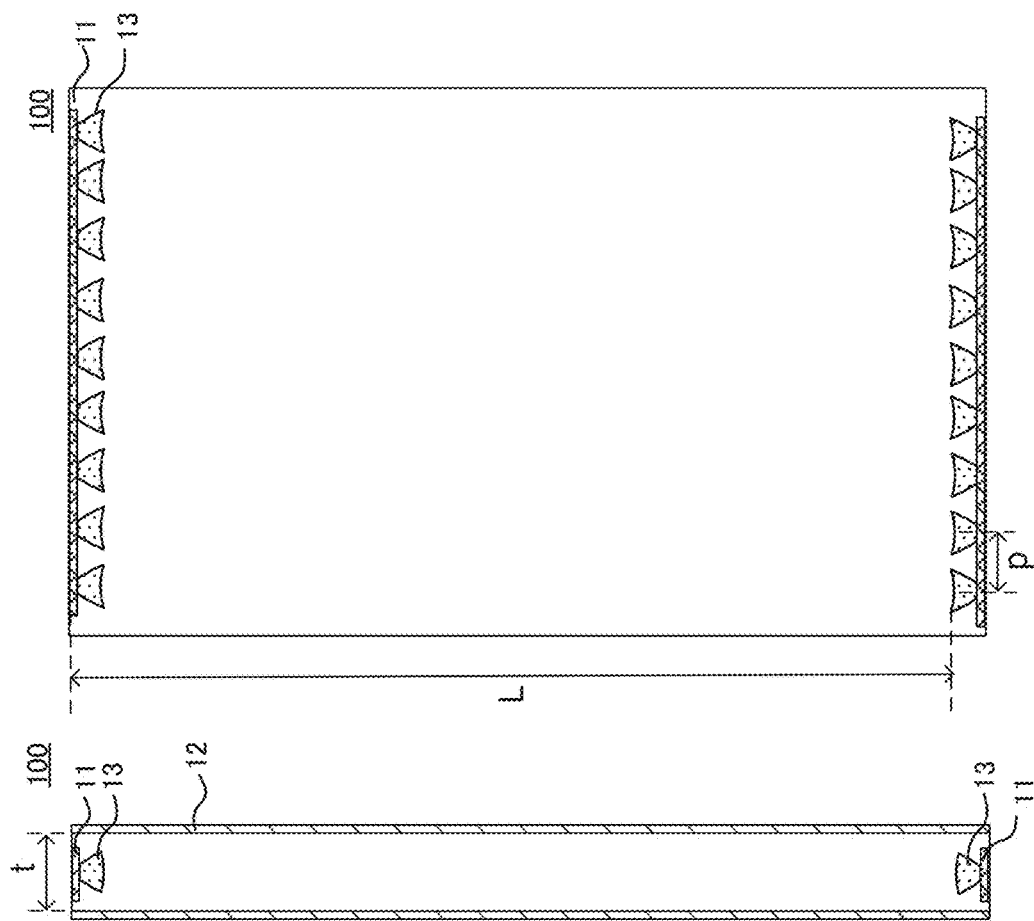
FIG. 2C
FIG. 2B
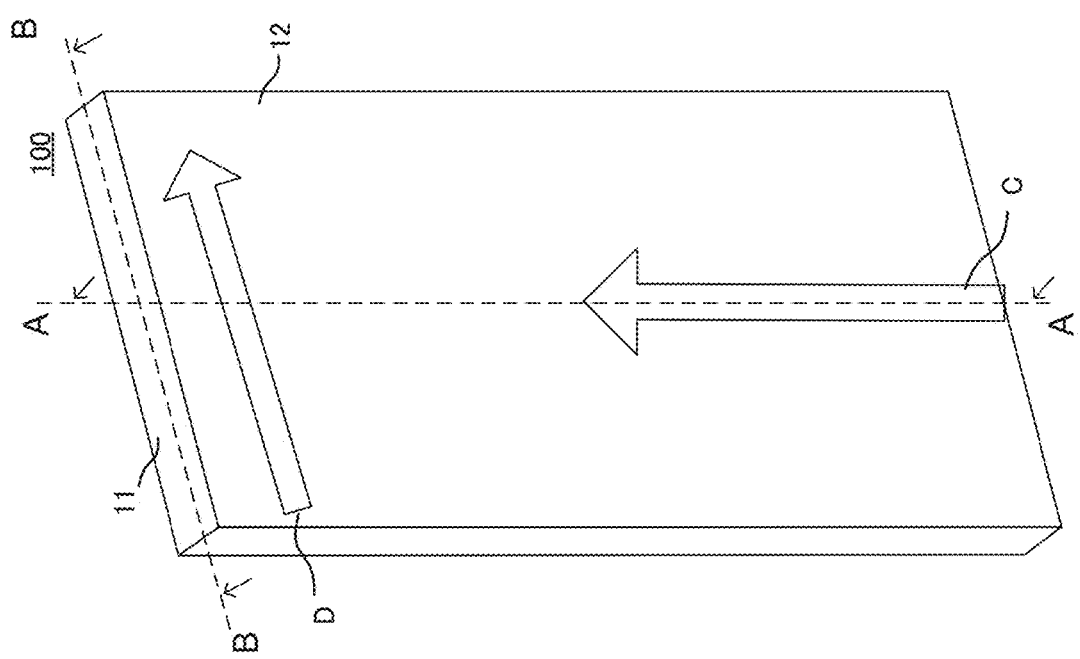
FIG. 2A

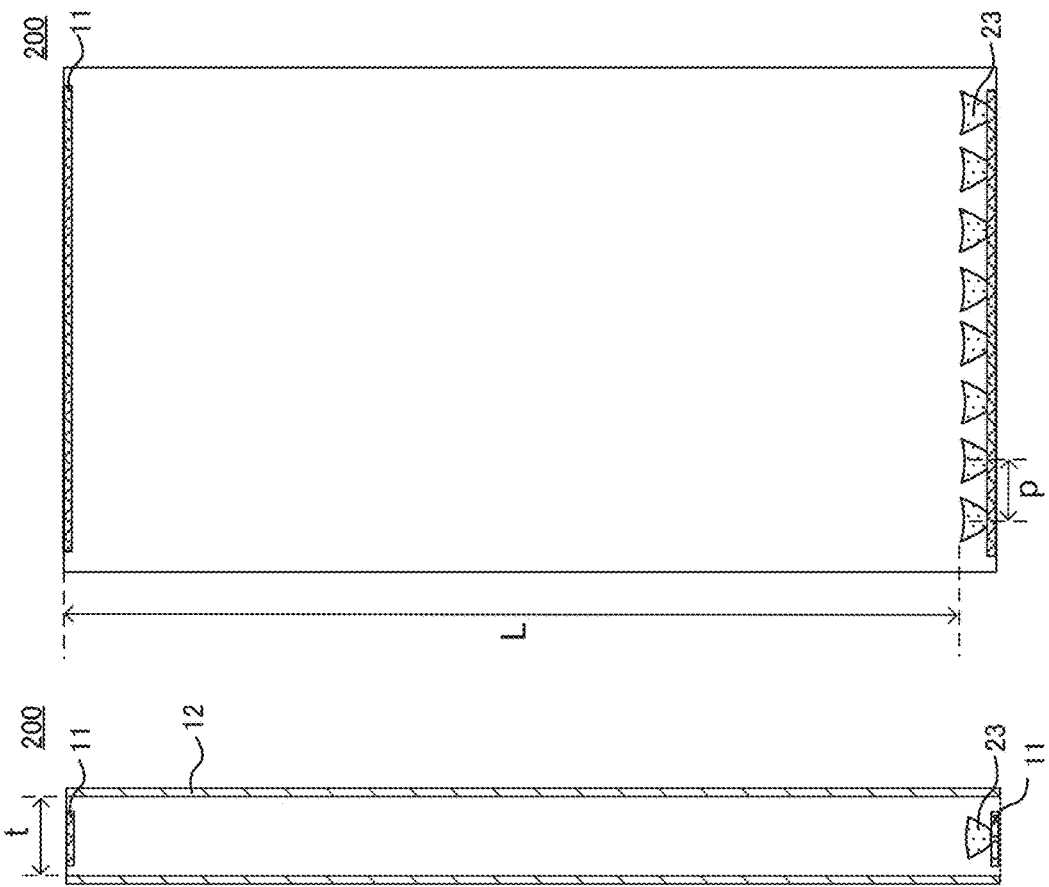
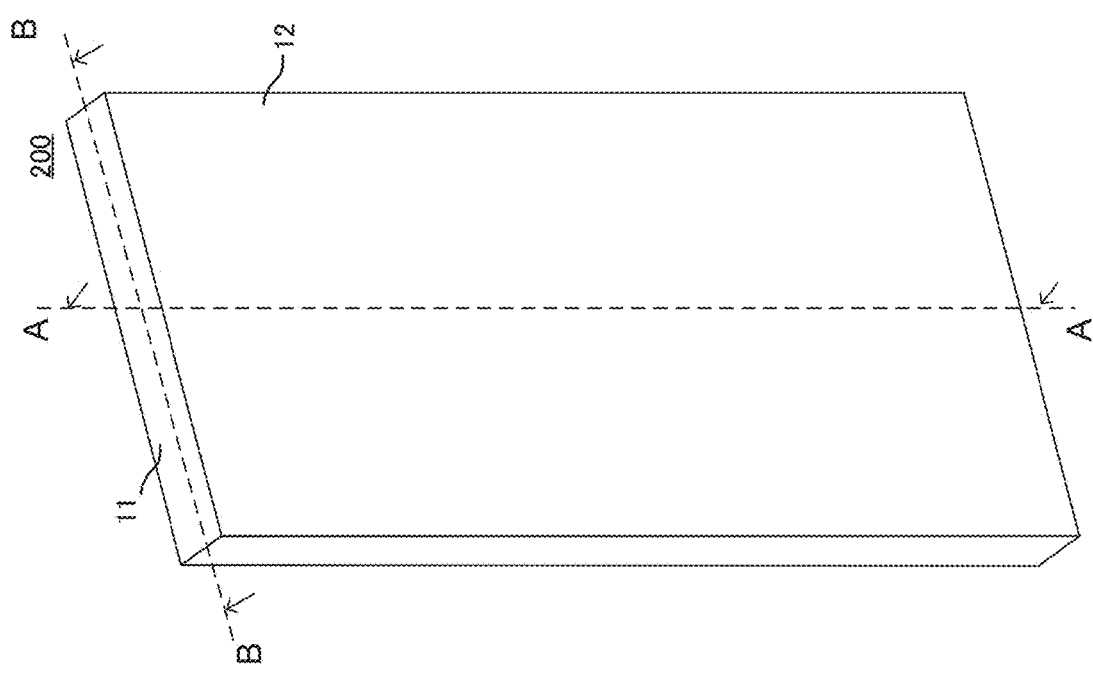

PLANAR LIGHT SOURCE DEVICE AND DISPLAY DEVICE

TECHNICAL FIELD

The present invention relates to a surface light source device and a display apparatus using the same.

BACKGROUND ART

An internal illumination signboard has a light source disposed therein so that the signboard itself emits light. Because of their excellent advertising effect, internal illumination signboards are used in various places.

In recent years, light-emitting diodes (LEDs) have been increasingly used as light sources of internal illumination signboards. Light-emitting diodes have excellent characteristics such as their small size, favorable power efficiency, capability of emitting light of brilliant colors, no risk of blowout, excellent initial drive characteristics, resistibility to vibration, and resistibility to repetitive switching between on and off.

A light-emitting diode emits light whose emission direction is not controlled, and therefore, when the light-emitting diode is used alone as a light source, the light emitted therefrom spreads and cannot efficiently illuminate the surface to be irradiated. For controlling the emission direction of light emitted from light-emitting diodes, a surface light source device including a plurality of light-emitting diodes and a lens covering the light-emitting diodes is proposed (see PTL 1).

CITATION LIST

Patent Literature

PTL 1
Japanese Patent Application Laid-Open No. 2009-289506

SUMMARY OF INVENTION

Technical Problem

FIG. 1 is a front view illustrating a surface to be irradiated of surface light source device 300 disclosed in PTL 1. Surface light source device 300 includes surface to be irradiated 32 disposed parallel to optical axes OA of light emitting elements (light-emitting diodes) 330. FIG. 1 shows regions irradiated with light in colors from white to black, and, in particular, shows regions which have light irradiation levels higher and appear brighter than other regions in black. Light flux controlling member (lens) 331 of surface light source device 300 disclosed in PTL 1 does not have a light collecting function in the array direction of light emitting elements 330. Therefore, the larger the distance from light emitting element 330 becomes, the less light amount is obtained, and thus a dark part is likely to be formed. In addition, light flux controlling member 331 of surface light source device 300 disclosed in PTL 1 does not have a light diffusing function. Therefore, a bright part (excessively bright region) is formed in the vicinity of each light emitting element 330, and a stripe-shaped dark part is formed between light emitting elements 330. In a conventional surface light source device as disclosed in PTL 1, the luminance in a region having a large distance from a light emitting element is likely to become unsatisfactory, and luminance unevenness (hereinafter also referred to as "stripe unevenness") is also likely to be formed between light emitting elements.

An object of the present invention is to provide a surface light source device including a plurality of light sources, and in the surface light source device, the luminance even in a region far from the light sources is satisfactorily high, and luminance unevenness between the light sources is less likely to be formed, and is to provide a display apparatus including the surface light source device.

Solution to Problem

A surface light source device of the present invention includes the following:

a pair of substrates substantially parallel to each other;

a pair of plates to be irradiated substantially parallel to each other, the plates to be irradiated being disposed between the substrates and disposed substantially perpendicular to the substrates; and a plurality of light emitting devices disposed at a predetermined pitch p on one or both of the substrates, the light emitting devices being disposed parallel to the plates to be irradiated, in which:

each of the light emitting devices includes a light emitting element and a light flux controlling member configured to control a travelling direction of light emitted from the light emitting element, the light flux controlling member includes an incidence surface that allows the light emitted from the light emitting element to be incident thereon; a total reflection surface that totally reflects part of the light incident on the incidence surface; and an emission surface that emits part of the light incident on the incidence surface and the light reflected by the total reflection surface, the emission surface has a linear or concave shape on a cross section parallel to the plates to be irradiated, the cross section passing through an optical axis of the light emitting element, and a linear or convex shape on a cross section perpendicular to the plates to be irradiated, the cross section passing through the optical axis, in which the emission surface is not a flat surface, distance L in a direction along the pair of plates to be irradiated from a surface of the light emitting device disposed on a first substrate of the pair of substrates to ends of the plates to be irradiated is 1,000 mm to 3,000 mm, the ends being on a substrate side where a second substrate of the pair of substrates is present, distance t between the plates to be irradiated is 30 mm to 150 mm, and the pitch p and the distance t between the plates to be irradiated satisfy p≤t; in which:

when the light emitting devices are disposed on both of the substrates, each light emitting device satisfies the following:

on a cross section of the light emitting device, the cross section passing through the optical axis and being perpendicular to the plates to be irradiated, with a direction of the optical axis being set at 0°, when luminous intensity of light emitted in a direction of 7.0° is set at $a_1$, and luminous intensity of light emitted in a direction of $\{\tan^{-1}(t/L)\}°$ is set at $a_2$ (where t represents the distance between the plates to be irradiated, L represents the distance in the direction along the pair of plates to be irradiated from the surface of the light emitting device disposed on the first substrate to the ends of the plates to be irradiated, the ends being on the substrate side), $a_1$ and $a_2$ satisfy the following formula (1):

$$a_1/a_2 < 0.5 \qquad (1),\text{ and}$$

when the light emitting devices are disposed on only one of the substrates, each light emitting device satisfies the following:

on the cross section of the light emitting device, the cross section passing through the optical axis and being perpendicular to the plates to be irradiated, with the direction of the optical axis being set at 0°, when the luminous intensity of the light emitted in the direction of 7.0° is set at $a_{11}$, and luminous intensity of light emitted in a direction of $\{\tan^{-1}(t/2L)\}$° is set at $a_{12}$ (where t represents the distance between the plates to be irradiated, L represents the distance in the direction along the pair of plates to be irradiated from the surface of the light emitting device disposed on the first substrate to the ends of the plates to be irradiated, the ends being on the substrate side), $a_{11}$ and $a_{12}$ satisfy the following formula (2):

$$a_{11}/a_{12} < 0.5 \qquad (2);\text{ and}$$

in which:

on the cross section of the light emitting device, the cross section passing through the optical axis and being perpendicular to the plates to be irradiated, with the direction of the optical axis being set at 0°, when light emission angles of light whose luminous intensities are 20%, 30%, 40% and 50% relative to maximum luminous intensity of the light emitted from the light emitting device are set at $b_{20}$, $b_{30}$, $b_{40}$, and $b_{50}$ (where $b_{50} < b_{40} < b_{30} < b_{20}$), respectively, and on a cross section of the light emitting device, the cross section passing through the optical axis and being parallel to the plates to be irradiated, with the direction of the optical axis being set at 0°, when light emission angles of light whose luminous intensities are 20%, 30%, 40% and 50% relative to the maximum luminous intensity of the light emitted from the light emitting device are set at $c_{20}$, $c_{30}$, $c_{40}$, and $c_{50}$ (where $c_{50} < c_{40} < c_{30} < c_{20}$), respectively, $b_{20}/c_{20}$, $b_{10}/c_{30}$, $b_{40}/c_{40}$, and $b_{50}/c_{50}$ satisfy the following formula (3):

$$(p/t \times 0.65) < b_{20}/c_{20}, b_{10}/c_{30}, b_{40}/c_{40}, b_{50}/c_{50} < 1 \qquad (3)$$

(where p represents the pitch and t represents the distance between the plates to be irradiated).

A display apparatus of the present invention includes the above-described surface light source device and a display part.

Advantageous Effects of Invention

In the surface light source device of the present invention, even a region far from the light source has satisfactorily high luminance, and luminance unevenness between the light sources is less likely to be formed.

BRIEF DESCRIPTION OF DRAWINGS

FIG. 2A is a perspective view illustrating a surface light source device according to Embodiment 1, FIG. 2B is a cross-sectional view taken along line A-A of FIG. 2A, and FIG. 2C is a cross-sectional view taken along line B-B of FIG. 2A;

FIG. 9A is a perspective view illustrating a surface light source device according to Embodiment 2, FIG. 9B is a cross-sectional view taken along line A-A of FIG. 9A, and FIG. 9C is a cross-sectional view taken along line B-B of FIG. 9A;

DESCRIPTION OF EMBODIMENT

Figure 1:
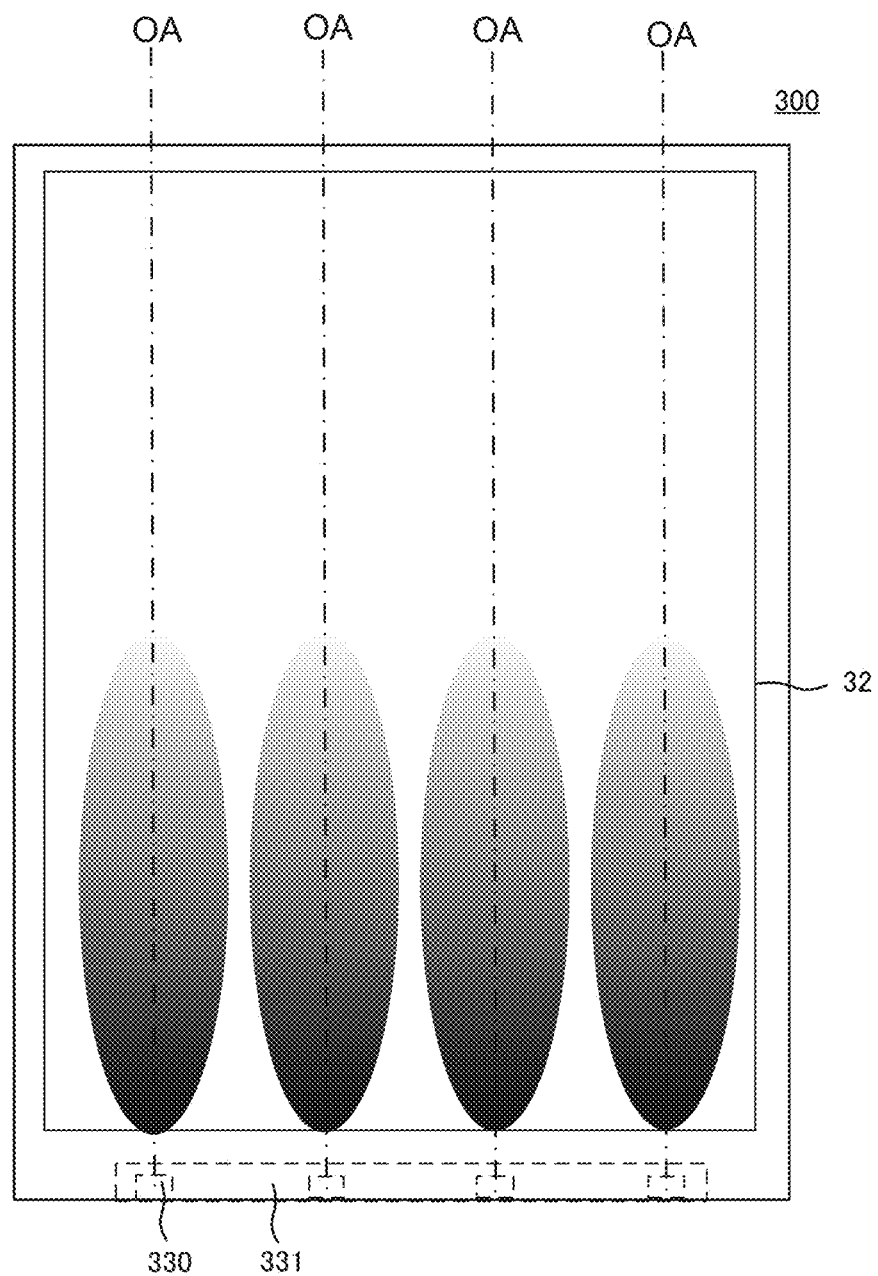
FIG. 1 is a front view illustrating a surface to be irradiated of a conventional surface light source device.

Hereinafter, embodiments of the present invention will be described in detail with reference to the accompanying drawings.

Embodiment 1

FIGS. 2A to 2C illustrate surface light source device 100 of Embodiment 1 of the present invention. FIG. 2A is a perspective view illustrating surface light source device 100, FIG. 2B is a cross-sectional view taken along line A-A of FIG. 2A, and FIG. 2C is a cross-sectional view taken along line B-B of FIG. 2A.

As illustrated in FIGS. 2B and 2C, surface light source device 100 of Embodiment 1 includes a pair of substrates 11 substantially parallel to each other, a pair of plates to be irradiated 12 each disposed between substrates 11 and substantially perpendicular to substrates 11, and a plurality of light emitting devices 13 disposed in a row on substrate 11 at a predetermined pitch (center-to-center distance) p. The plurality of light emitting devices 13 are arranged parallel to plate to be irradiated 12. In the present embodiment, light emitting devices 13 are disposed on both substrates 11, and light is emitted from each substrate 11 side toward the center side of surface light source device 100 in the length direction thereof. A surface of at least one of plate to be irradiated 12 is used as a light emitting surface in surface light source device 100. As used herein, the direction from one substrate 11 to other substrate 11 is also referred to as "length direction," the array direction of light emitting devices 13 as "width direction," and the direction from one plate to be irradiated 12 to the other plate to be irradiated 12 as "thickness direction."

In the present embodiment, substrates 11 are a pair of rectangular flat plates that constitute the bottom surface and top surface of surface light source device 100, and that are disposed substantially parallel to each other. On each of the mutually facing surfaces of respective substrates 11, a plurality of light emitting devices 13 are fixed in a row at a predetermined pitch p. The shape of substrate 11 is not limited to that of a rectangular flat plate as long as substrate 11 can hold the plurality of light emitting devices 13, and may be appropriately selected in accordance with, for example, the shape of surface light source device 100. The material of substrate 11 may be selected from, for example, resins and metals. In addition, substrate 11 itself may be composed of a material that reflects light (for example, metal), or a layer for reflecting light (metal layer or white layer) may be formed on the surface of substrate 11. When substrate 11 is configured to reflect light emitted from light emitting device 13, light emitted from light emitting device 13 in the direction toward the substrate 11 is reflected toward the center side of surface light source device 100 in the length direction, and thus luminance in an area close to the center of surface light source device 100 in the length direction becomes more likely to increase. In the present embodiment, distance L in the direction along the pair of plates to be irradiated 12 from the surface of light emitting device 13 disposed on one substrate 11 to the end of plate to be irradiated 12 (the end is on the other substrate 11 side) is 1,000 mm to 3,000 mm.

Plates to be irradiated 12 are a pair of substantially rectangular flat plates that constitute the side surfaces of surface light source device 100, and that are disposed substantially parallel to each other. Plates to be irradiated 12 are positioned so as to hold therebetween substrates 11 and light emitting devices 13. In the present embodiment, both of the two plates to be irradiated 12 are composed of a member configured to transmit light emitted from light emitting device 13 while diffusing the light (hereinafter also referred to as "diffusion plate"); however, one of the two plates to be irradiated 12 may be a reflector configured to reflect light toward the other plate to be irradiated 12 (diffusion plate). The diffusion plate is composed of a material that can transmit light emitted from light emitting device 13, and may be a plate that is composed of, for example, a resin or glass and has a light diffusing function. The reflector reflects light emitted from light emitting device 13, toward the diffusion plate. The reflector itself may be composed of a material that reflects light (for example, metal), or a layer for reflecting light (metal layer or white layer) may be formed on the surface of the reflector.

In the present embodiment, distance t between mutually facing plates to be irradiated 12 is set to be equal to or longer than below-described pitch p (center-to-center distance) between light emitting devices 13 (i.e., p≤t is satisfied). Specifically, distance t between plates to be irradiated 12 is 30 mm to 150 mm.

Multiple light emitting devices 13 are disposed in a row on surface 11 at a predetermined pitch p. The number of light emitting devices 13 in surface light source device 100 may be appropriately selected in accordance with the application of surface light source device 100, required light amount, and the like. Pitch p may be appropriately set at a value equal to or shorter than the above-described distance t between plates to be irradiated 12.

Figure 3:
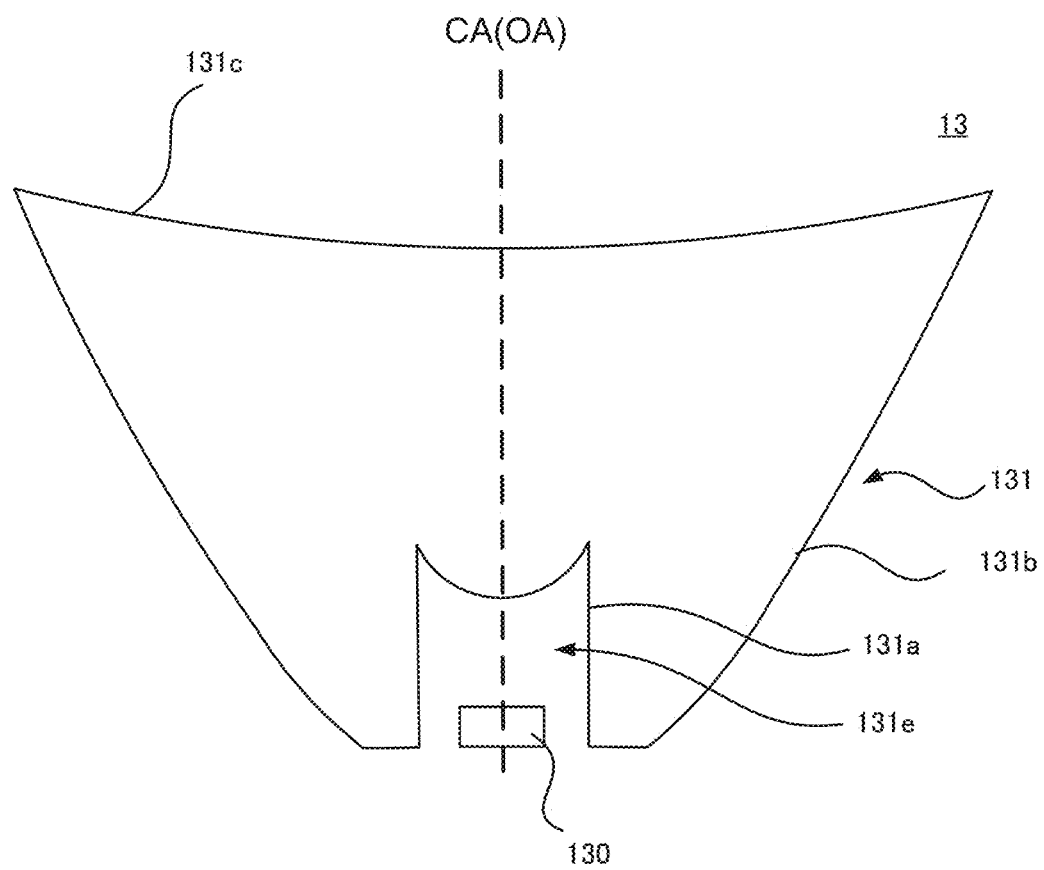
FIG. 3 is a cross-sectional view of a light emitting device in the surface light source device according to Embodiment 1.

As illustrated in FIG. 3, each light emitting device 13 includes light emitting element 130 and light flux controlling member 131. The luminous intensity of light emitted from light emitting device 13 is preferably in a manner such that the luminous intensity is largest in the optical axis direction and becomes gradually smaller as the angle between the light and the optical axis becomes larger (for example, lambertian light distribution). FIG. 3 is a cross-sectional view of light emitting device 13 on a surface parallel to plate to be irradiated 12. For clearly indicate the structure of each member, hatching is omitted in FIG. 3.

Light emitting element 130 is a light source of surface light source device 100. Light emitting element 130 may be any element such as light-emitting diode (LED) as long as it has a light emitting surface. The light emitting surface that faces light flux controlling member 131 of light emitting element 130 (hereinafter also simply referred to as "light emitting surface") may be in any shape such as circular, rectangular and dome-shaped with a sealing resin. In addition, the area of the light emitting surface of light emitting element 130 may be appropriately selected in accordance with the application of surface light source device 100 and the like. Light emitting element 130 is disposed in recess 131e formed in the bottom of light flux controlling member 131 (see FIG. 3).

Light flux controlling member 131 controls the travelling direction of light emitted from light emitting element 130. Light flux controlling member 131 is positioned relative to light emitting element 130 by a supporting member (not illustrated), and disposed in such a way that central axis CA of light flux controlling member 131 coincides with optical axis OA of light emitting element 130, as illustrated in FIG. 3. Light flux controlling member 131 may be formed from any material as long as the material allows the light emitted from light emitting element 130 to pass through. Examples of the materials for light flux controlling member 131 include light-transmissive resins such as polymethylmethacrylate (PMMA), polycarbonate (PC) and epoxy resin (EP), and glass. Light flux controlling member 131 is formed by, for example, injection molding.

Figure 4A:
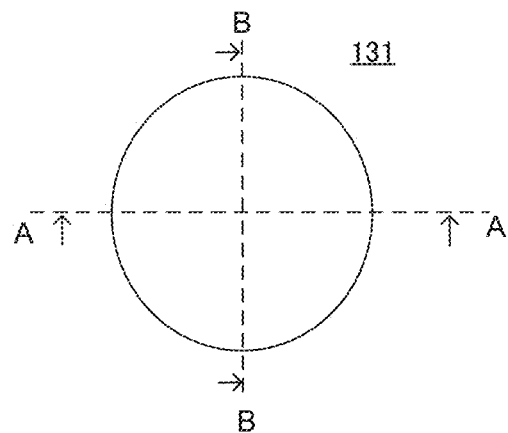
FIG. 4A is a plan view of a light flux controlling member in the surface light source device according to Embodiment 1.
Figure 4B:
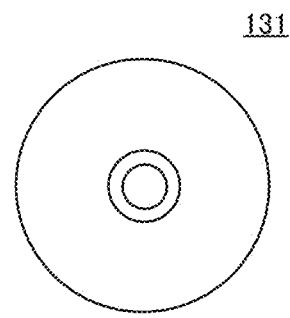
FIG. 4B is a bottom view of the light flux controlling member.
Figure 4C:
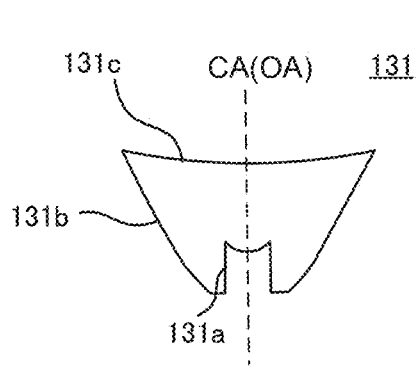
FIG. 4C is a cross-sectional view taken along line A-A of FIG. 4A.
Figure 4D:
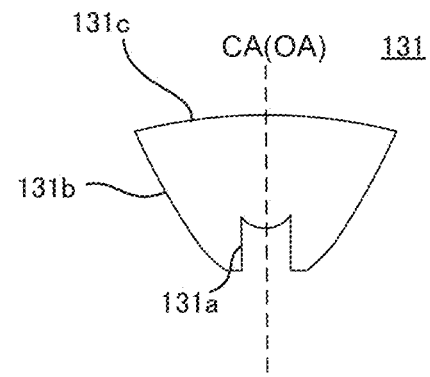
FIG. 4D is a cross-sectional view taken along line B-B of FIG. 4A.

FIG. 4A is a plan view of light flux controlling member 131 in the present embodiment, FIG. 4B is a bottom view of light flux controlling member 131, FIG. 4C is a cross-sectional view taken along line A-A of FIG. 4A, and FIG. 4D is a cross-sectional view taken along line B-B of FIG. 4A. Line A-A of FIG. 4 is substantially parallel to plate to be irradiated 12, and line B-B of FIG. 4A is substantially perpendicular to plate to be irradiated 12. Both lines pass through central axis CA of light flux controlling member 131 (optical axis OA of light emitting element 130). For clearly indicate the structure of light flux controlling member 131, hatching is omitted in FIGS. 4A to 4D.

Light flux controlling member 131 includes incidence surface 131a that allows light emitted from light emitting element 130 to be incident thereon, total reflection surface 131b that totally reflects part of light incident on incidence surface 131a, and emission surface 131c that emits light that is incident on incidence surface 131a and directly reaches emission surface 131c and the light reflected by total reflection surface 131b.

Incidence surface 131a is an inner surface of recess 131e that is formed in the bottom of light flux controlling member 131. Incidence surface 131a is formed at a position so as to face light emitting element 130 and intersect with optical axis OA of light emitting element 130. Incidence surface 131a is a rotationally symmetrical surface about central axis CA. Incidence surface 131a includes an inner top surface constituting the top surface of recess 131e and an inner side surface constituting the side surface of recess 131e. The inner top surface may be planar, or in a shape of a curved surface protruding downward or upward. In the present embodiment, the inner top surface is formed in the shape of a curved surface protruding downward. The inner diameter of the inner side surface may remain substantially the same from the inner top surface side to the opening edge side, or may gradually increase from the inner top surface side to the opening edge side. In the present embodiment, the inner diameter of the inner side surface remains substantially the same from the inner top surface side to the opening edge side.

Total reflection surface 131b extends from the outer edge of the bottom of light flux controlling member 131 to the outer edge of emission surface 131c. Total reflection surface 131b is a rotationally symmetrical surface formed so as to surround central axis CA of light flux controlling member 131. The diameter of total reflection surface 131b gradually increases from the incidence surface 131a side (bottom side) to the emission surface 131c side. The generatrix of total reflection surface 131b is an arc-like curve protruding outward (away from central axis CA) (see FIG. 4C and FIG. 4D). As used herein, "total reflection surface" is intended to be a surface totally reflecting light that is emitted from the light emission center of light emitting element 130 and reaches the total reflection surface. Total reflection surface 131b reflects most of light that is emitted from positions of light emitting element 130 other than the light emission center thereof and reaches total reflection surface 131b; however, total reflection surface 131b is not intended to totally reflect all of the light.

Emission surface 131c is positioned on a side opposite to that of incidence surface 131a (bottom side) in light flux controlling member 131, and formed to intersect with central axis CA of light flux controlling member 131. In the present embodiment, the shape of emission surface 131c on a cross section (of light flux controlling member 131) which passes through central axis CA differs depending on whether the cross section is substantially parallel (see FIG. 4C) or substantially perpendicular (see FIG. 4D) to plate to be irradiated 12. Specifically, the shape of emission surface 131c is concave or linear (concave in the present embodiment) on the cross section (of light flux controlling member 131) which is substantially parallel to plate to be irradiated 12, and convex or linear (convex in the present embodiment) on the cross section which is substantially perpendicular to plate to be irradiated 12. The shape does not become linear on both cross sections at the same time. In other words, emission surface 131c does not become a flat surface. Examples of the combinations of shapes of emission surface 131c on the respective cross sections substantially parallel and perpendicular to plate to be irradiated 12 include concave and linear, linear and convex, and concave and convex.

A flange (not illustrated) may be provided between the outer edges of respective total reflection surface 131b and emission surface 131c, as necessary. In the present embodiment, incidence surface 131a is not directly connected to total reflection surface 131b with another surface formed therebetween; however, incidence surface 131a may be directly connected to total reflection surface 131b on the bottom side of light flux controlling member 131.

Specific shapes of incidence surface 131a, total reflection surface 131b and emission surface 131c of light flux controlling member 131 are respectively set in such a way that surface light source device 100 satisfies the following two conditions.

—First Condition

Figure 6:
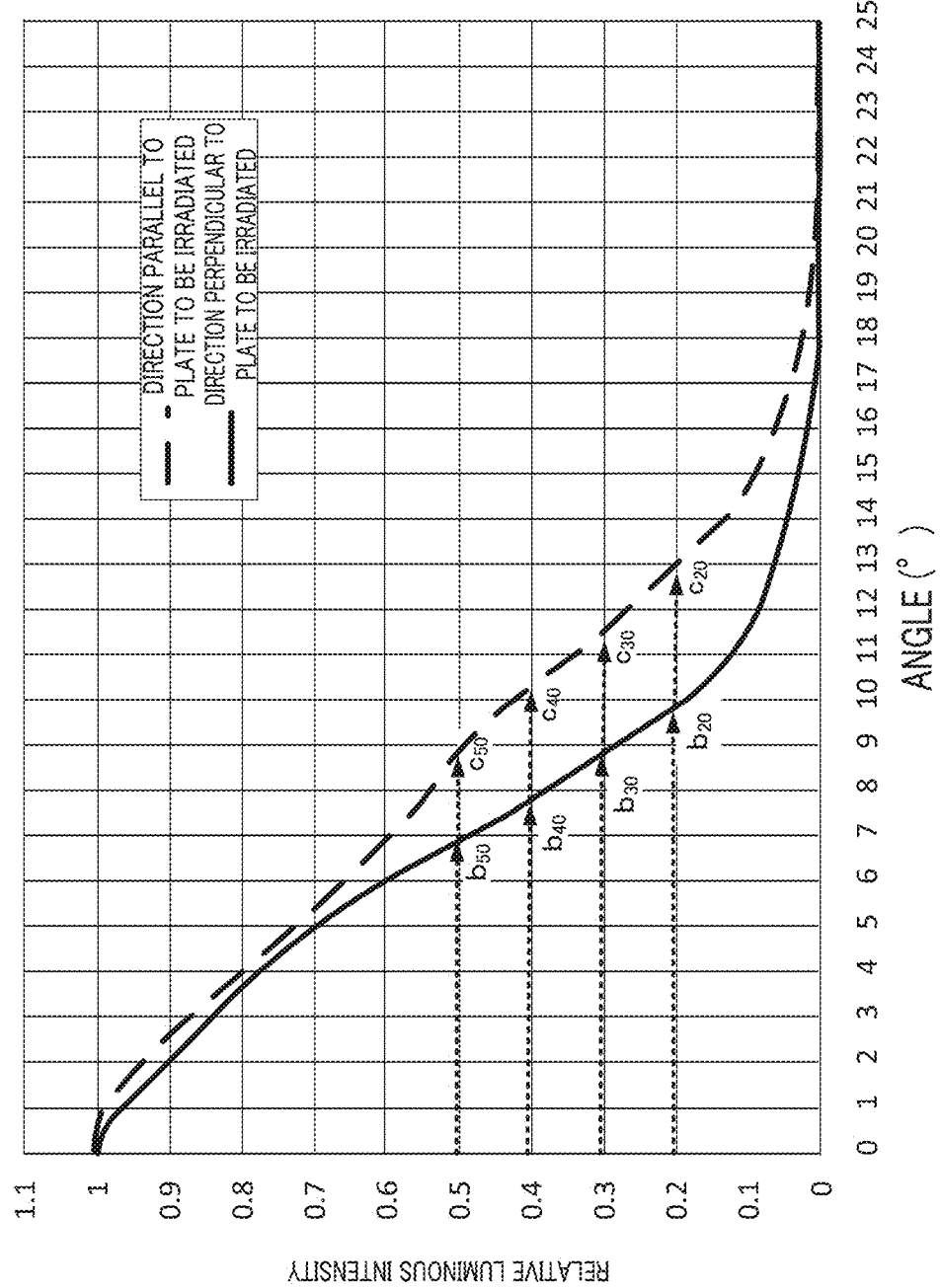
FIG. 6 is a graph showing relative luminous intensity of light emitted from the light emitting device in the surface light source device according to Embodiment 1.

On the cross section (of light emitting device 13) which passes through optical axis OA of light emitting element 130 and is perpendicular to plate to be irradiated 12, with the direction of optical axis OA being set at 0°, when light emission angles of light whose luminous intensities are 20%, 30%, 40% and 50% relative to the maximum luminous intensity of light emitted from light emitting device 13 are set at $b_{20}$, $b_{30}$, $b_{40}$, and $b_{50}$ (where $b_{50} < b_{40} < b_{30} < b_{20}$), respectively, and on the cross section (of light emitting device 13) which passes through optical axis OA of light emitting element 130 and is parallel to plates to be irradiated 12, with the direction of optical axis OA being set at 0°, when light emission angles of light whose luminous intensities are 20%, 30%, 40% and 50% relative to the maximum luminous intensity of the light emitted from light emitting device 13 are set at $c_{20}$, $c_{30}$, $c_{40}$, and $c_{50}$ (where $c_{50} < c_{40} < c_{30} < c_{20}$), respectively (see FIG. 6), all of $b_{20}/c_{20}$, $b_{30}/c_{30}$, $b_{40}/c_{40}$, and $b_{50}/c_{50}$ satisfy the following formula (3):

$$(p/t \times 0.65) < b_x/c_x < 1 \tag{3}$$

(where p represents the above-described pitch, t represents a distance between the plates to be irradiated, and x represents a subscript of each b or each c).

The above-described formula (3) indicates that, in the thickness direction of surface light source device 100, light emitting device 13 collects light to the area close to the center of surface light source device 100 in the length direction, and in the width direction of surface light source device 100, light emitting device 13 expands light. Typically, when a plurality of light emitting devices 13 are arranged, an excessively bright region (bright part) is more likely to be formed in the vicinity of light emitting device 13, and a stripe-shaped dark part (stripe unevenness) is more likely to be formed between light emitting devices 13. When the light emitted from light emitting device 13 satisfies the above-described formula (3), luminance in the area close to the center of surface light source device 100 in the length direction is increased, and also stripe unevenness is less likely to be formed in the periphery of light emitting device 13. In addition, on the light emitting surface of surface light source device 100, it become possible for the minimum luminance in a region corresponding to 150 mm or less from the surface of light emitting device 13 to be more than 0.9 relative to the maximum luminance in the same region. When the minimum luminance relative to the maximum luminance is more than 0.9, stripe unevenness in the width direction of surface light source device 100 becomes less likely to be recognized when a person actually observes surface light source device 100.

—Second Condition

On the cross section (of light emitting device 13) which passes through optical axis OA of light emitting element 130 and is perpendicular to plate to be irradiated 12, with the direction of optical axis OA being set at 0°, when the luminous intensity of light emitted in the direction of 7.0° is set at $a_1$, and the luminous intensity of light emitted in the direction of $\{\tan^{-1}(t/L)\}°$ is set at $a_2$ (where t represents a distance between the above-described plates to be irradiated, L represents a distance in a direction along the pair of plates to be irradiated 12 from the surface of light emitting device 13 disposed on one of substrates 11 to the end (of plate to be irradiated 12) on the other substrate 11 side), $a_1$ and $a_2$ satisfy the following formula (1):

$$a_1/a_2 < 0.5 \quad (1).$$

Figure 5:
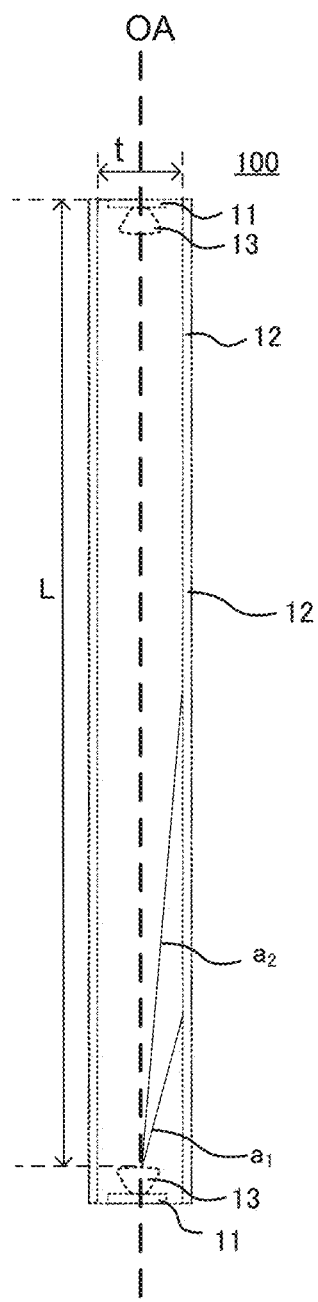
FIG. 5 is a schematic view illustrating light emitted from the light emitting device in the surface light source device according to Embodiment 1.

The above-described formula (1) specifies the luminous intensity of light emitted from light emitting device 13 to the cross section perpendicular to plate to be irradiated 12. Formula (1) indicates that the luminous intensity $a_1$ of light emitted from light emitting device 13 toward plate to be irradiated 12 in the periphery of light emitting device 13 is less than 0.5 relative to luminous intensity $a_2$ of light emitted from light emitting device 13 toward plate to be irradiated 12 in the area close to the center of surface light source device 100 in the length direction, that is, $a_1$ is relatively low (see FIG. 5).

In a surface light source device having a configuration as in the present embodiment, the luminance in the periphery of a light emitting device tends to become highest, and the luminance in the area close to the center of the surface light source device in the length direction tends to become lowest. When the difference in the luminance is large, the area close to the center of the surface light source device in the length direction may appear very dark. Setting the above-described luminous intensity ratio ($a_1/a_2$) to less than 0.5 can increase the amount of light traveling toward the area close to the center of surface light source device 100 in the length direction. Satisfying both formula (3) and formula (1) enables the minimum luminance (luminance in the area close to the center of plate to be irradiated 12 in the length direction) to become more than 0.2 relative to the maximum luminance (luminance in the periphery of light emitting device 13) in the entire light emitting surface of surface light source device 100. When the minimum luminance is more than 0.2 relative to the maximum luminance, luminance unevenness in the length direction of surface light source device 100 becomes less likely to be recognized when a person actually observes surface light source device 100.

(Simulation for Light Distribution Characteristics of Surface Light Source Device)

For surface light source device 100 of Embodiment 1 having a structure as illustrated in FIG. 2, the luminance of the light emitting surface and luminous intensity of light emitted toward each direction from a light emitting device were simulated. The emission surfaces 131c of light flux controlling members 131 in surface light source devices 1 to 7 all had a shape illustrated in FIG. 4. That is, the shape of emission surface 131c was concave on the cross section substantially parallel to plate to be irradiated 12, and planar on the cross section substantially perpendicular to plate to be irradiated 12. The shape (curvature and the like) of emission surface 131c of light flux controlling member 131 was appropriately changed for every surface light source device. For comparison, for a surface light source device using a commercially available light flux controlling member, the luminance thereof and the luminous intensity of light emitted toward each direction from a light emitting device were simulated. The commercially available light flux controlling member used for the comparison included a planar incidence surface, a concave (mortar shaped) emission surface, and a plurality of prisms formed in a shape of bracelets on its concave incline. The emission surface of the commercially available light flux controlling member had the same shape on the respective cross sections substantially parallel and perpendicular to plate to be irradiated 12. In surface light source devices 1, 2 and 6, the number of light emitting devices 13 disposed on each substrate 11 was assumed to be eight, and in surface light source devices 3, 4, 5 and 7, the number of light emitting devices 13 disposed on each substrate 11 was assumed to be nine. In each surface light source device, pitch p was 50 mm Distance L from the surface of light emitting device 13 disposed on one of substrates 11 to the end (of plate to be irradiated 12) on the other substrate 11 side was 2,000 mm, and distance t between plates to be irradiated 12 was 50 or 60 mm.

Tables 1 and 2 show the values of $a_1/a_2$ in formula (1) and the values of $b_{20}/c_{20}$, $b_{10}/c_{30}$, $b_{40}/c_{40}$, and $b_{50}/c_{50}$ in formula (3) calculated in the simulation. Tables 1 and 2 also show the evaluations whether the minimum luminance/maximum luminance is more than 0.2 or not in the entire light emitting surface of each surface light source device 100, and whether the minimum luminance/maximum luminance is more than 0.9 or not in the region corresponding to 150 mm or less from the surface of light emitting device 13 in the light emitting surface of each surface light source device 100.

TABLE 1

| Distance between pair of plates to be irradiated (mm) | Commercially available lens | Surface light source device 1 | | Surface light source device 2 | | Surface light source device 3 | | Surface light source device 4 | |
|---|---|---|---|---|---|---|---|---|---|
| | t = 50 | t = 50 | t = 60 | t = 50 | t = 60 | t = 50 | t = 60 | t = 50 | t = 60 |
| $a_1/a_2$ | 0.49 | 0.19 | 0.10 | 0.22 | 0.07 | 0.49 | 0.31 | 0.53 | 0.31 |
| $a_1/a_2 < 0.5$ Formula (1) | Yes | Yes | Yes | Yes | Yes | Yes | Yes | No | Yes |
| Minimum luminance/ Maximum luminance in entire light emitting surface > 0.2 | | Yes | Yes | Yes | Yes | Yes | Yes | No | Yes |
| $b_{50}/c_{50}$ | 0.20 | 0.45 | 0.45 | 0.77 | 0.77 | 0.81 | 0.81 | 0.58 | 0.58 |
| $b_{40}/c_{40}$ | 0.21 | 0.48 | 0.48 | 0.86 | 0.86 | 0.83 | 0.83 | 0.59 | 0.59 |
| $b_{30}/c_{30}$ | 0.22 | 0.50 | 0.50 | 0.81 | 0.81 | 0.81 | 0.81 | 0.57 | 0.57 |
| $b_{20}/c_{20}$ | 0.25 | 0.54 | 0.54 | 0.78 | 0.78 | 0.75 | 0.75 | 0.56 | 0.56 |
| p/t × 0.65 | 0.65 | 0.65 | 0.54 | 0.65 | 0.54 | 0.65 | 0.54 | 0.65 | 0.54 |
| (p/t × 0.65) < $b_x/c_x$ < 1 Formula (3) | No | No | No | Yes | Yes | Yes | Yes | No | Yes |
| Minimum | Yes | No | No | Yes | Yes | Yes | Yes | No | Yes |

TABLE 1-continued

| Distance between pair of plates to be irradiated (mm) | Commercially available lens t = 50 | Surface light source device 1 | | Surface light source device 2 | | Surface light source device 3 | | Surface light source device 4 | |
|---|---|---|---|---|---|---|---|---|---|
| | | t = 50 | t = 60 | t = 50 | t = 60 | t = 50 | t = 60 | t = 50 | t = 60 |
| luminance/ Maximum luminance within 150 mm from light emitting device surface > 0.9 | | | | | | | | | |

TABLE 2

| Distance between pair of plates to be irradiated (mm) | Surface light source device 5 | | Surface light source device 6 | | Surface light source device 7 | |
|---|---|---|---|---|---|---|
| | t = 50 | t = 60 | t = 50 | t = 60 | t = 50 | t = 60 |
| $a_1/a_2$ | 0.51 | 0.33 | 0.51 | 0.33 | 0.53 | 0.32 |
| $a_1/a_2 < 0.5$ Formula (1) | No | Yes | No | Yes | No | Yes |
| Minimum luminance/ Maximum luminance in entire light emitting surface > 0.2 | No | Yes | No | Yes | No | Yes |
| $b_{50}/c_{50}$ | 0.70 | 0.70 | 0.78 | 0.78 | 0.52 | 0.52 |
| $b_{40}/c_{40}$ | 0.68 | 0.68 | 0.75 | 0.75 | 0.52 | 0.52 |
| $b_{30}/c_{30}$ | 0.68 | 0.68 | 0.74 | 0.74 | 0.50 | 0.50 |
| $b_{20}/c_{20}$ | 0.66 | 0.66 | 0.73 | 0.73 | 0.49 | 0.49 |
| $p/t \times 0.65$ | 0.65 | 0.54 | 0.65 | 0.54 | 0.65 | 0.54 |
| $(p/t \times 0.65) < b_x/c_x < 1$ Formula (3) | Yes | Yes | Yes | Yes | No | No |
| Minimum luminance/ Maximum luminance within 150 mm from light emitting device surface > 0.9 | Yes | Yes | Yes | Yes | No | No |

Figure 7A:
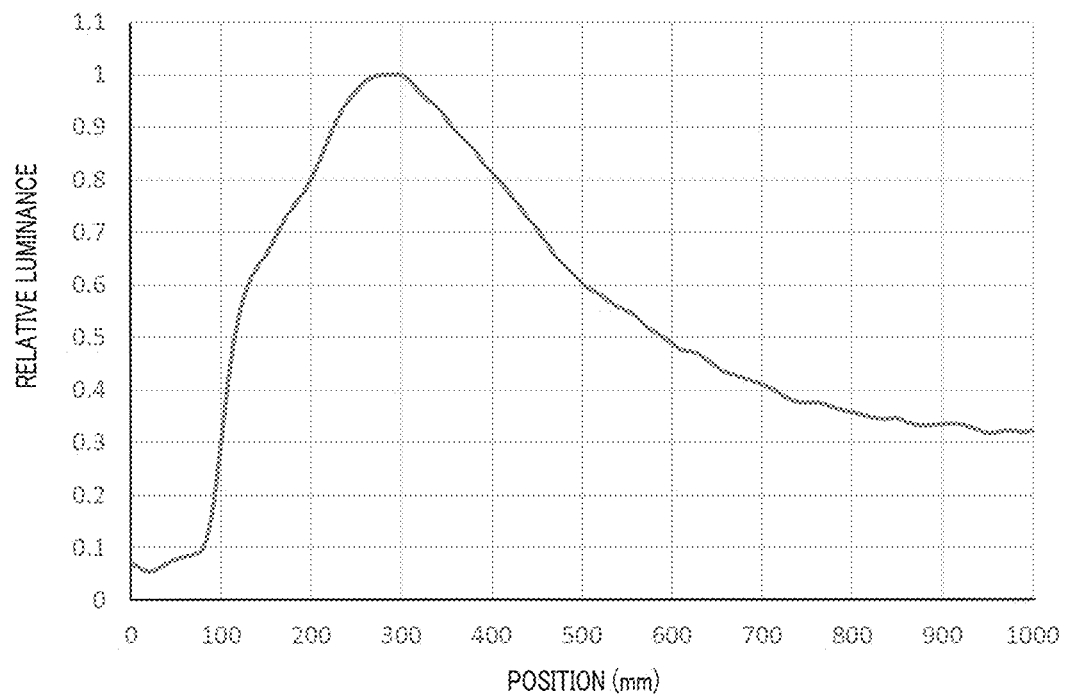
FIG. 7A illustrates simulation showing relative luminance in the length direction of a light emitting surface of the surface light source device according to Embodiment 1.
Figure 7B:
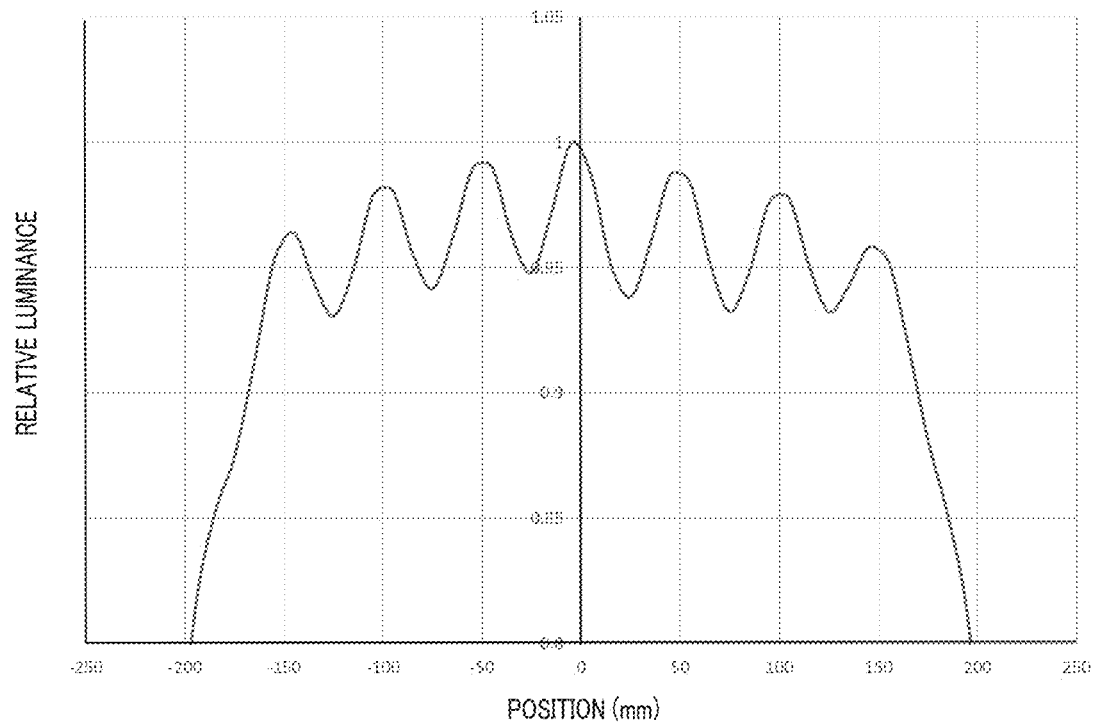
FIG. 7B illustrates simulation showing relative luminance in the width direction of the light emitting surface of the surface light source device.
Figure 8A:
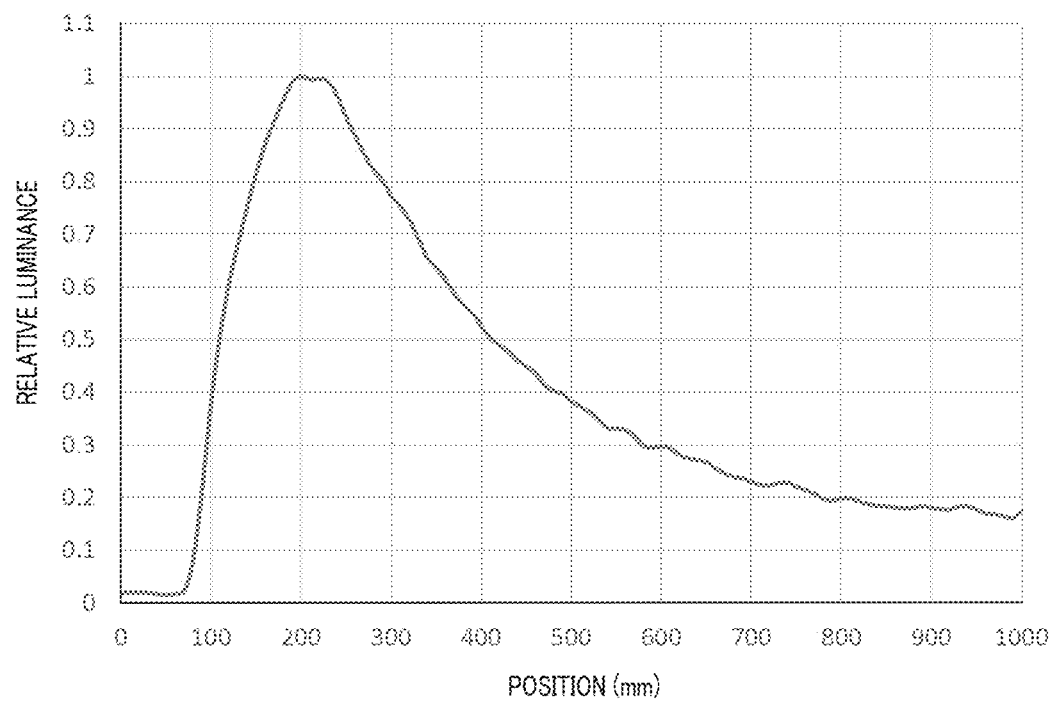
FIG. 8A illustrates simulation showing relative luminance in the length direction of a light emitting surface of a comparative surface light source device.
Figure 8B:
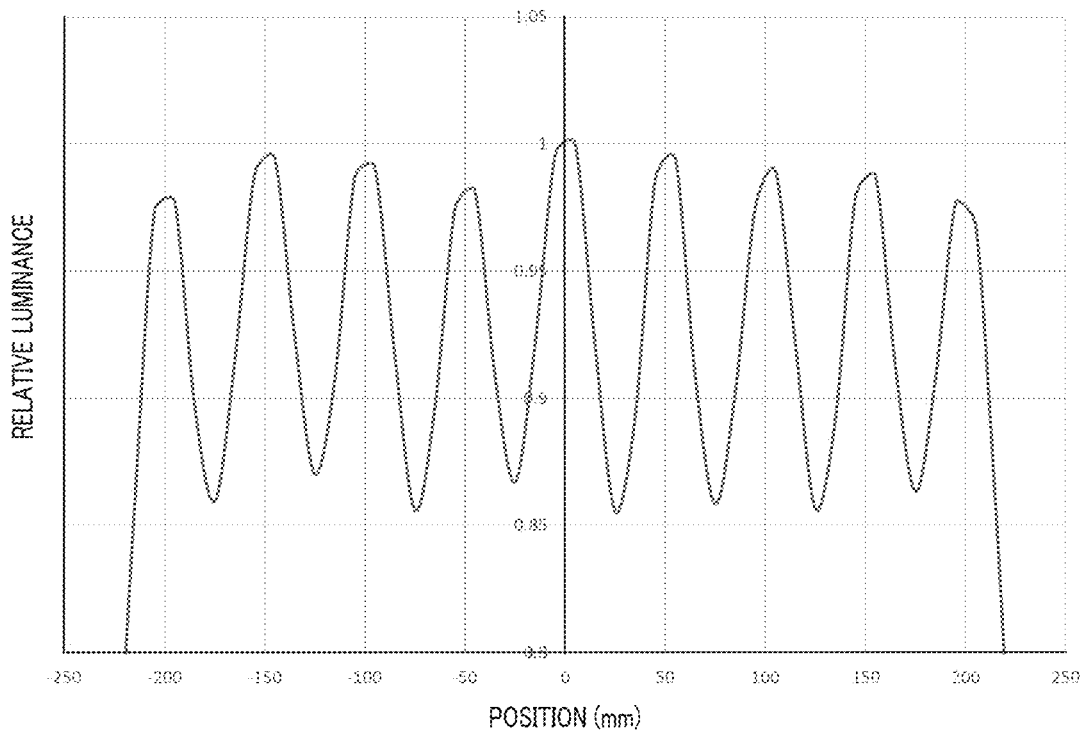
FIG. 8B illustrates simulation showing relative luminance in the width direction of the light emitting surface of the comparative surface light source device.

FIG. 7A illustrates values of relative luminance in a range in plate to be irradiated 12 (light diffusion plate) from the end thereof on the substrate 11 side to 1,000 mm (region indicated with arrow C in FIG. 2A) in surface light source device 2 (t=50 mm), namely the relative luminance in the length direction. The abscissa in FIG. 7A represents the position from the end of plate to be irradiated 12 (light diffusion plate) on the substrate 11 side. FIG. 7B illustrates values of relative luminance at positions of 200 mm from the end of plate to be irradiated 12 on the substrate 11 side (region indicated with arrow D in FIG. 2A) in surface light source device 2 (t=50 mm), namely the relative luminance in the width direction. The ordinate in FIG. 7B represents the position from the center of a light emitting device positioned at the center in the array direction of the light emitting devices. In a similar manner, FIGS. 8A and 8B illustrate values of relative luminance of surface light source device 4 (t=50 mm) in the length direction and the width direction.

As shown in Tables 1 and 2, all the surface light source devices that satisfied formula (3) had the minimum luminance/maximum luminance of more than 0.9 in the region corresponding to 150 mm or less from the surface of the light emitting device, and thus stripe unevenness formed between the light emitting devices became less apparent (see FIG. 7B). The surface light source devices that did not satisfy formula (3) meanwhile had the minimum luminance/maximum luminance of 0.9 or less, and a dark part was formed between the light emitting devices to make stripe unevenness more visible (see FIG. 8B).

Further, as shown in Tables 1 and 2, all the surface light source devices that satisfied formula (3) and formula (1) had the minimum luminance/maximum luminance of more than 0.2 in the entire light emitting surface of each surface light source device, and thus had satisfactory luminance even in the center area of the surface light source device in the length direction (see FIG. 7A). The surface light source devices that did not satisfy formula (3) or formula (1) meanwhile had the minimum luminance/maximum luminance of 0.2 or less in the light emitting surface of each surface light source device, and thus had lowered luminance in the area close to the center of the surface light source device in the length direction (see FIG. 8A).

As shown in Table 1 and 2, even with the same light flux controlling members, a surface light source device having different distance t between the plates to be irradiated could not satisfy formula (1) and formula (3) in some cases. Therefore, the shape of the light flux controlling member should be appropriately selected in accordance with distance L in the direction along the pair of plates to be irradiated of the surface light source device from the surface of light emitting device disposed on one of the substrates to the end (of the plate to be irradiated) on the other substrate side, distance t between the plates to be irradiated, pitch p at which light emitting devices are disposed, and the like.

(Effects)

In the surface light source device of present embodiment, as described above, the shape of light flux controlling member is controlled so as to satisfy formula (1) and formula (3) in accordance with the distance in the direction along the pair of plates to be irradiated from the surface of a light emitting device disposed on one of the substrates to the end (of the plate to be irradiated) on the other substrate side, the distance between the plates to be irradiated, a pitch between arranged light emitting devices, and the like. Such controlling enables the light flux controlling member included in the light emitting device to collect light, in the thickness direction of the surface light source device, toward the center side of the surface light source device in the length direction, and to expand light in the width direction of the surface light source device. Therefore, in the surface light source device, stripe unevenness in the periphery of the light emitting device becomes less visible, and the luminance in the area close to the center in the length direction becomes satisfactorily high.

Embodiment 2

FIG. 9 illustrates surface light source device 200 of Embodiment 2 of the present invention. FIG. 9A is a perspective view illustrating surface light source device 200, FIG. 9B is a cross-sectional view taken along line A-A of FIG. 9A, and FIG. 9C is a cross-sectional view taken along line B-B of FIG. 9A.

As illustrated in FIGS. 9A to 9C, surface light source device 200 of Embodiment 2 includes a pair of substrates 11 substantially parallel to each other, a pair of plates to be irradiated 12 each disposed between substrates 11 and substantially perpendicular to substrates 11, and a plurality of light emitting devices 23 disposed in a row on substrate 11 at a predetermined pitch p. The plurality of light emitting devices 23 are arranged parallel to plate to be irradiated 12. In the present embodiment, light emitting devices 23 are disposed on only one of substrates 11, and light is emitted from the one substrate 11 toward the other substrate 11 side. To the same components as those of surface light source device 100 of Embodiment 1, the same reference signs are allotted, and the descriptions for the components will be omitted.

Light emitting device 23 of the present embodiment includes a light emitting element and a light flux controlling member. The light emitting element is the same as that of light emitting device 13 of Embodiment 1. The light flux controlling member controls the travelling direction of light emitted from the light emitting element, and is positioned relative to the light emitting element by a supporting member, and disposed in such a way that central axis CA of the light flux controlling member coincides with optical axis OA of the light emitting element. The light flux controlling member includes an incidence surface that allows light emitted from the light emitting element to be incident thereon, a total reflection surface that totally reflects part of light incident on the incidence surface, and an emission surface that emits part of light incident on the incidence surface and the light reflected by the reflection surface. The incidence surface, total reflection surface and emission surface of the light flux controlling member of the present embodiment are the same as those of Embodiment 1.

Specific shapes of the incidence surface, total reflection surface and emission surface of the light flux controlling member of the present embodiment are respectively set in such a way that surface light source device 200 satisfies the following two conditions.

—First Condition

On the cross section (of light emitting device 23) which passes through optical axis OA of the light emitting element and is perpendicular to plate to be irradiated 12, with the direction of optical axis OA being set at 0°, when light emission angles of light whose luminous intensities are 20%, 30%, 40% and 50% relative to the maximum luminous intensity of light emitted from light emitting device 23 are set at $b_{20}$, $b_{30}$, $b_{40}$, and $b_{50}$ (where $b_{50}<b_{40}<b_{30}<b_{20}$), respectively, and on the cross section (of light emitting device 23) which passes through optical axis OA of the light emitting element and is parallel to plates to be irradiated 12, with the direction of optical axis OA being set at 0°, when light emission angles of light whose luminous intensities are 20%, 30%, 40% and 50% relative to the maximum luminous intensity of the light emitted from light emitting device 23 are set at $c_{20}$, $c_{30}$, $c_{40}$, and $c_{50}$ (where $c_{50}<c_{40}<c_{30}<c_{20}$), respectively, all of $b_{20}/c_{20}$, $b_{30}/c_{30}$, $b_{40}/c_{40}$, and $b_{50}/c_{50}$ satisfy the following formula (3):

$$(p/t \times 0.65) < bx/cx < 1 \qquad (3)$$

(where p represents the above-described pitch, t represents a distance between the plates to be irradiated, and x represents a subscript of each b or each c).

The above-described formula (3) indicates that, in the thickness direction of surface light source device 200, light emitting device 23 collects light to the substrate 11 side where no light emitting device is disposed, and in the width direction of surface light source device 200, light emitting device 23 expands light. Typically, when a plurality of light emitting devices 23 are arranged as described above, a stripe-shaped dark part (stripe unevenness) is more likely to be formed between light emitting devices 23. When the light emitted from light emitting device 23 satisfies the above-described formula (3), luminance on the substrate 11 side where no light emitting device 23 is disposed is increased, and also stripe unevenness is less likely to be formed in the periphery of light emitting device 23. In addition, on the light emitting surface of surface light source device 200, it become possible for the minimum luminance in a region corresponding to 150 mm or less from the surface of light emitting device 23 to be more than 0.9 relative to the maximum luminance in the same region. When the minimum luminance relative to the maximum luminance is more than 0.9, stripe unevenness in the width direction of surface light source device 200 becomes less likely to be recognized when a person actually observes surface light source device 200.

—Second Condition

On the cross section (of light emitting device 23) which passes through optical axis OA of the light emitting element and is perpendicular to plate to be irradiated 12, with the direction of optical axis OA being set at 0°, when the luminous intensity of light emitted in the direction of 7.0° is set at $a_{11}$, and the luminous intensity of light emitted in the direction of $\{\tan^{-1}(t/2L)\}°$ is set at $a_{12}$ (where t represents a distance between the above-described plates to be irradiated, L represents a distance in a direction along the pair of plates to be irradiated 12 from the surface of light emitting device 23 disposed on one of substrates 11 to the end (of plate to be irradiated 12) on the other substrate 11 side), $a_{11}$ and $a_{12}$ satisfy the following formula (2):

$$a_{11}/a_{12} < 0.5 \qquad (2).$$

Figure 10:
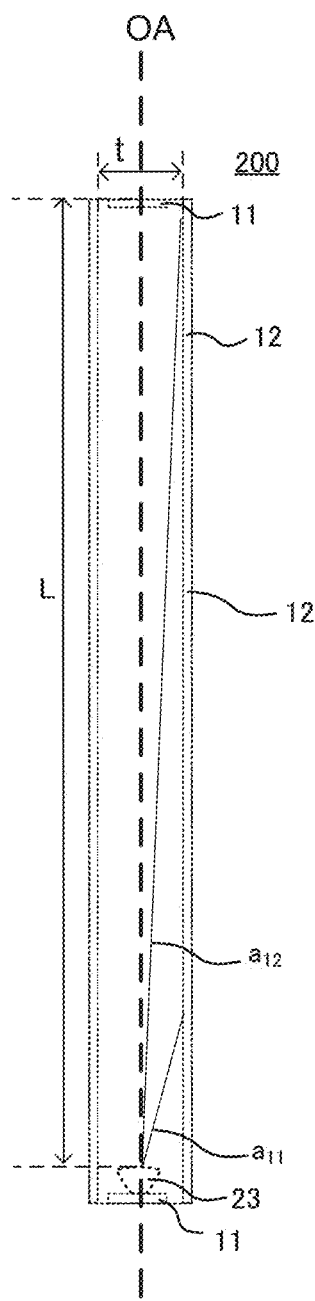
FIG. 10 is a schematic view illustrating light emitted from a light emitting device in the surface light source device according to Embodiment 2.

The above-described formula (2) specifies the luminous intensity of light emitted from light emitting device 23 to the cross section perpendicular to plate to be irradiated 12 of surface light source device 200. Formula (2) indicates that the luminous intensity $a_{11}$ of light emitted toward plate to be irradiated 12 in the periphery of light emitting device 23 is less than 0.5 relative to luminous intensity $a_{12}$ of light emitted toward plate to be irradiated 12 in an area close to substrate 11 where no light emitting device 23 is disposed, that is, an is relatively low (see FIG. 10).

In a surface light source device having a configuration as in the present embodiment, the luminance in the periphery of a light emitting device tends to become highest, and the luminance in the area close to the substrate where no light emitting device is disposed tends to become lowest. When the difference in the luminance is large, one side of the surface light source device in the length direction appears bright and the other side appears dark. Setting the above-described luminous intensity ratio ($a_{11}/a_{12}$) to less than 0.5 can increase the amount of light traveling toward the substrate 11 side where no light emitting device 23 is disposed. Satisfying both formula (3) and formula (2) enables the minimum luminance (luminance in the area close to substrate 11 where no light emitting device 23 is disposed) to become more than 0.2 relative to the maximum luminance (luminance in the periphery of light emitting device 23) in the entire light emitting surface of surface light source device 200. When the minimum luminance is more than 0.2 relative to the maximum luminance, luminance unevenness in the length direction of surface light source device 200 becomes less likely to be recognized when a person actually observes surface light source device 200.

(Effects)

In the surface light source device of present embodiment, as described above, the shape of light flux controlling member is also controlled so as to satisfy formula (2) and formula (3) in accordance with the distance in the direction along the pair of plates to be irradiated from the surface of a light emitting device disposed on one of the substrates to the end (of the plate to be irradiated) on the other substrate side, the distance between the plates to be irradiated, a pitch between arranged light emitting devices, and the like. Such controlling enables the light flux controlling member to collect light, in the thickness direction of the surface light source device, toward the substrate side where no light emitting device is disposed, and to expand light in the width direction of the surface light source device. Therefore, in the surface light source device, stripe unevenness in the periphery of the light emitting device becomes less visible, and the luminance in the area close to the center in the length direction becomes satisfactorily high.

[Other Features]

Figure 11:
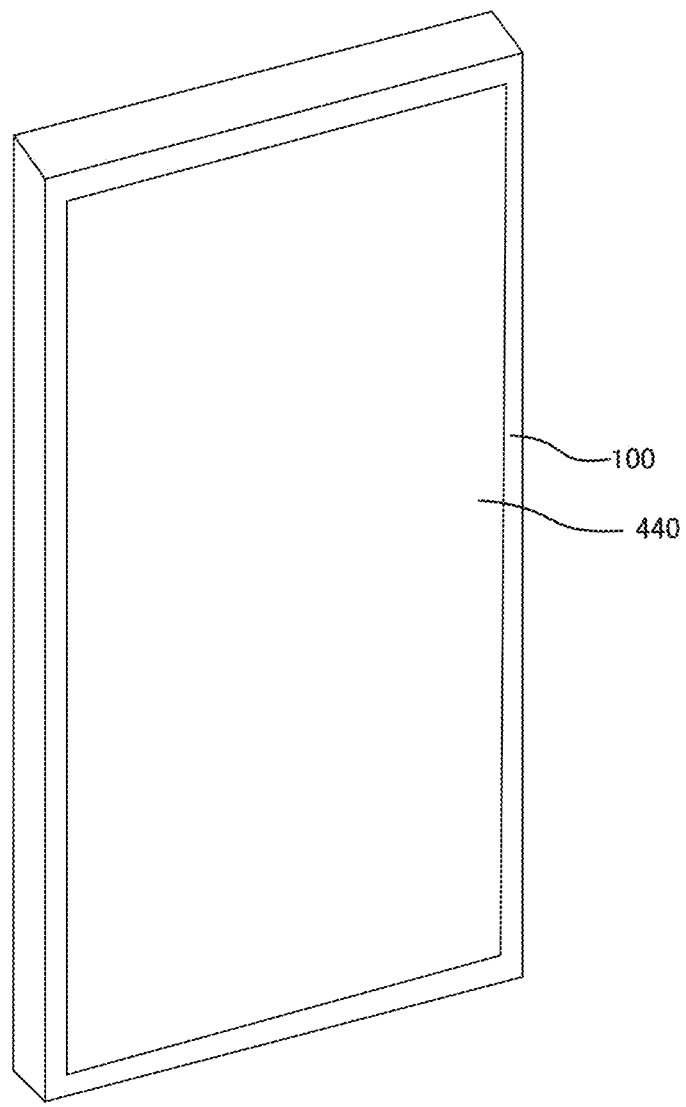
FIG. 11 is a schematic view illustrating a display apparatus of the present invention.

The surface light source device of the present invention may be used as a display apparatus by combining with display member 440 as illustrated in, for example, FIG. 11. Display member 440 may be any member as long as the member can perform various displays by using light emitted from surface light source device 100.

This application is entitled to and claims the benefit of Japanese Patent Application No. 2017-018720 filed on Feb. 3, 2017, the disclosure of which including the specification and drawings is incorporated herein by reference in its entirety.

INDUSTRIAL APPLICABILITY

In the surface light source device of the present invention, even a region far from a light source has satisfactorily high luminance. In addition, luminance unevenness is less likely to be formed in the periphery of the light source. Therefore, the surface light source device of the present invention is particularly advantageous as, for example, a light source of an indoor or outdoor internal illumination signboard.

REFERENCE SIGNS LIST 100, 200, 300 Surface light source device
11 Substrate
12 Plate to be irradiated
13, 23 Light emitting device
130, 330 Light emitting element
131, 331 Light flux controlling member
131a Incidence surface
131b Total reflection surface
131c Emission surface
131e Recess
CA Central axis
OA Optical axes

What is claimed is:

1. A surface light source device, comprising:
a pair of substrates substantially parallel to each other;
a pair of plates to be irradiated substantially parallel to each other, the plates to be irradiated being disposed between the substrates and disposed substantially perpendicular to the substrates; and
a plurality of light emitting devices disposed at a predetermined pitch p on one or both of the substrates, the light emitting devices being disposed parallel to the plates to be irradiated,
wherein:
each of the light emitting devices includes a light emitting element and a light flux controlling member configured to control a travelling direction of light emitted from the light emitting element,
the light flux controlling member includes an incidence surface that allows the light emitted from the light emitting element to be incident thereon; a total reflection surface that totally reflects part of the light incident on the incidence surface; and an emission surface that emits part of the light incident on the incidence surface and the light reflected by the total reflection surface,
the emission surface has a linear or concave shape on a cross section parallel to the plates to be irradiated, the cross section passing through an optical axis of the light emitting element, and a linear or convex shape on a cross section perpendicular to the plates to be irradiated, the cross section passing through the optical axis, wherein the emission surface is not a flat surface,
distance L in a direction along the pair of plates to be irradiated from a surface of the light emitting device disposed on a first substrate of the pair of substrates to ends of the plates to be irradiated is 1,000 mm to 3,000 mm, the ends being on a substrate side where a second substrate of the pair of substrates is present,
distance t between the plates to be irradiated is 30 mm to 150 mm, and
the pitch p and the distance t between the plates to be irradiated satisfy p≤t;
wherein:
when the light emitting devices are disposed on both of the substrates, each light emitting device satisfies the following:
on a cross section of the light emitting device, the cross section passing through the optical axis and being perpendicular to the plates to be irradiated, with a direction of the optical axis being set at 0°, when luminous intensity of light emitted in a direction of 7.0° is set at $a_1$, and luminous intensity of light emitted in a direction of $\{\tan^{-1}(t/L)\}°$ is set at $a_2$ (wherein t represents the distance between the plates to be irradiated, L represents the distance in the direction along the pair of plates to be irradiated from the surface of the light emitting device disposed on the first substrate to the ends of the plates to be irradiated, the ends being on the substrate side),
$a_1$ and $a_2$ satisfy the following formula (1):

$$a_1/a_2 < 0.5 \qquad (1), \text{and}$$

when the light emitting devices are disposed on only one of the substrates, each light emitting device satisfies the following:

on the cross section of the light emitting device, the cross section passing through the optical axis and being perpendicular to the plates to be irradiated, with the direction of the optical axis being set at 0°, when the luminous intensity of the light emitted in the direction of 7.0° is set at $a_{11}$, and luminous intensity of light emitted in a direction of $\{\tan^{-1}(t/2L)\}°$ is set at $a_{12}$ (wherein t represents the distance between the plates to be irradiated, L represents the distance in the direction along the pair of plates to be irradiated from the surface of the light emitting device disposed on the first substrate to the ends of the plates to be irradiated, the ends being on the substrate side), $a_{11}$ and $a_{12}$ satisfy the following formula (2):

$$a_{11}/a_{12} < 0.5 \quad (2); \text{ and}$$

wherein:

on the cross section of the light emitting device, the cross section passing through the optical axis and being perpendicular to the plates to be irradiated, with the direction of the optical axis being set at 0°, when light emission angles of light whose luminous intensities are 20%, 30%, 40% and 50% relative to maximum luminous intensity of the light emitted from the light emitting device are set at $b_{20}$, $b_{30}$, $b_{40}$, and $b_{50}$ (wherein $b_{50} < b_{40} < b_{30} < b_{20}$), respectively, and on a cross section of the light emitting device, the cross section passing through the optical axis and being parallel to the plates to be irradiated, with the direction of the optical axis being set at 0°, when light emission angles of light whose luminous intensities are 20%, 30%, 40% and 50% relative to the maximum luminous intensity of the light emitted from the light emitting device are set at $c_{20}$, $c_{30}$, $c_{40}$, and $c_{50}$ (wherein $c_{50} < c_{40} < c_{30} < c_{20}$), respectively, $b_{20}/c_{20}$, $b_{30}/c_{30}$, $b_{40}/c_{40}$, and $b_{50}/c_{50}$ satisfy the following formula (3):

$$(p/t \times 0.65) < b_{20}/c_{20}, b_{30}/c_{30}, b_{40}/c_{40}, b_{50}/c_{50} < 1 \quad (3)$$

(wherein p represents the pitch and t represents the distance between the plates to be irradiated).

2. The surface light source device according to claim 1, wherein:

the emission surface of the light flux controlling member has the concave shape on the cross section parallel to the plates to be irradiated, the cross section passing through the optical axis of the light emitting element, and the convex shape on the cross section perpendicular to the plates to be irradiated, the cross section passing through the optical axis.

3. A display apparatus, comprising:
the surface light source device according to claim 2, and a display part.

4. A display apparatus, comprising:
the surface light source device according to claim 1, and a display part.

* * * * *